United States Patent
Woerlee et al.

(10) Patent No.: US 6,291,352 B1
(45) Date of Patent: *Sep. 18, 2001

(54) METHOD OF MANUFACTURING A SEMICONDUCTOR DEVICE

(75) Inventors: Pierre H. Woerlee; Casparus A. H. Juffermans; Andreas H. Montree, all of Eindhoven (NL)

(73) Assignee: U.S. Philips Corporation, New York, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,819
(22) Filed: Oct. 7, 1998

(30) Foreign Application Priority Data

Oct. 14, 1997 (EP) .................................................. 97203206

(51) Int. Cl.[7] .................................................. H01L 21/311
(52) U.S. Cl. ............................ 438/699; 438/758; 438/933
(58) Field of Search .................... 438/694, 699, 438/692, 758, 759, 933

(56) References Cited

U.S. PATENT DOCUMENTS

| | | | |
|---|---|---|---|
| 4,435,445 | * 3/1984 | Alfred et al. | 427/54.1 |
| 5,091,767 | * 2/1992 | Bean et al. | 357/60 |
| 5,604,157 | 2/1997 | Dai et al. | 437/200 |
| 5,702,963 | * 12/1997 | Vu et al. | 437/41 |

FOREIGN PATENT DOCUMENTS

| | | | |
|---|---|---|---|
| 09260293A | 3/1997 | (JP) | H01L/21/205 |

* cited by examiner

*Primary Examiner*—Benjamin L. Utech
*Assistant Examiner*—Kim-Chan Chen
(74) *Attorney, Agent, or Firm*—Steven R. Biren

(57) ABSTRACT

Amorphous or polycrystalline silicon layers are sometimes used in the metallization steps of IC processes, for example as antireflex coatings or as etching stopper layers for etching back of tungsten. A problem is that such a layer cannot be provided by CVD or LPCVD on account of the high deposition temperature which is not compatible with standard Al metallizations. Other deposition techniques, such as sputtering or plasma CVD, often lead to a lesser material quality, a longer processing time per wafer, or a worse step covering. According to the invention, the layer is provided by CVD or LPCVD at a temperature below 500° C. under the addition of Ge. The $Ge_xSi_{1-x}$ layer (8) thus obtained is found to have good properties as regards step covering, optical aspects, electrical aspects, and etching aspects, and is compatible with any Al metallization (6) already present.

17 Claims, 6 Drawing Sheets

METHOD OF MANUFACTURING A SEMICONDUCTOR DEVICE

BACKGROUND OF THE INVENTION

The invention relates to a method of manufacturing a semiconductor device with a semiconductor body, by which method a polycrystalline or amorphous semiconductor layer is provided over the entire device in a stage in which the device has been provided with a metallization layer. Such methods are generally known, inter alia for the manufacture of integrated circuits. The stage of the process in which the wiring, for example in the form of aluminum tracks, is provided is called the back end of the process. It is no longer possible to carry out process steps at high temperatures in this stage, i.e. at temperatures higher than 500° C., on account of the presence of the aluminum. This temperature limitation has the disadvantage that certain process steps are no longer possible in this stage, steps which can indeed be carried out advantageously in an earlier stage and which would also offer important advantages in the back end of the process. Among the process steps belonging to this category are the CVD (or LPCVD) deposition of polycrystalline (or amorphous) silicon. Amorphous or polycrystalline silicon layers may be used in the metallization stage of IC processes as antireflex coatings or as etching stoppers for etching back of tungsten layers or as dielectric layers in metal-metal antifuses in programmable arrays. The deposition temperature, however, is usually higher than 550° C., which is not compatible with standard aluminum metallizations. Polycrystalline or amorphous silicon is accordingly often deposited in an alternative manner at a lower temperature, for example by means of plasma CVD or by sputtering. These processes often result in a lesser material quality, inter alia owing to impurities and/or a less good step covering. In addition, these processes are usually single-wafer processes, in contrast to CVD which takes place in batches and accordingly as a much shorter process time.

SUMMARY OF THE INVENTION

The invention has for its object inter alia to render it possible to use silicon-containing layers formed by means of CVD also in the back end of standard IC processes.

According to the invention, a method of the kind described in the opening paragraph is for this purpose characterized in that the semiconductor layer is provided as a $Ge_xSi_{1-x}$ layer, referred to as GeSi layer for short hereinafter, by means of CVD at a temperature which is lower than 550° C., and preferably lower than 500° C., x representing the molar fraction of Ge. The presence of Ge as opposed to pure Si renders it possible to lower the deposition temperature considerably, i.e. to a temperature below 500° C., so that it is possible to provide polycrystalline or amorphous silicon layers by means of CVD in the presence of Al or some other metal layer which melts or reacts chemically at a comparatively low temperature.

An important embodiment in which the advantages of a polycrystalline or amorphous GeSi layer are obtained in photolithographical process steps is characterized in that a photoresist layer is provided over the device after the GeSi layer and is patterned through exposure and development. An embodiment frequently occurring in the manufacture of integrated circuits is characterized in that the GeSi layer is provided on a dielectric layer, and in that the pattern formed in the photoresist layer is transferred into the GeSi layer and the subjacent dielectric layer by means of etching. If the GeSi layer is mainly used as an antireflex layer here, the pattern may advantageously be transferred into the GeSi layer and subsequently, with the photoresist layer being present, into the subjacent dielectric layer, whereupon the photoresist layer is removed. A preferred embodiment, in which the advantages of the use of a hard mask are obtained owing to the GeSi layer, is characterized in that, after the pattern has been transferred into the GeSi layer, the photoresist layer is removed before the dielectric layer is subjected to the etching treatment.

An important field of application of the invention is the field of providing the interconnections in integrated circuits where, after etching, a second metal layer is provided over the surface thus obtained, filling up entirely the openings in the dielectric layer formed by etching, from which second metal layer a pattern corresponding to the pattern in the dielectric layer is subsequently formed by means of a homogeneous removal of metal. The metal layer may be advantageously etched back by means of chemical-mechanical polishing. A preferred embodiment, which has the advantage inter alia that metal remnants and/or other impurities are also removed, is characterized in that the material-removing step is stopped when the GeSi layer is reached, whereupon the GeSi layer is removed by means of an etching treatment.

The use of undoped amorphous silicon layers as antifuses is known, which layers can be brought from a non-conducting state into a conducting state through the application of a sufficiently strong electric field. A further embodiment of a method according to the invention, which may be used inter alia in the manufacture of programmable non-volatile memories or, for example, so-called FPGAs (field programmable gate arrays), is characterized in that the GeSi layer is provided in the form of an amorphous layer between two metal conductors so as to form an electrically programmable element which can be brought from a high-ohmic state into a low-ohmic state through the application of a voltage between the metal conductors.

BRIEF DESCRIPTION OF THE DRAWING

These and other aspects of the invention will be explained in more detail with reference to a few embodiments. In the drawing.

DESCRIPTION OF THE PREFERRED EMBODIMENTS

Figure 1A:
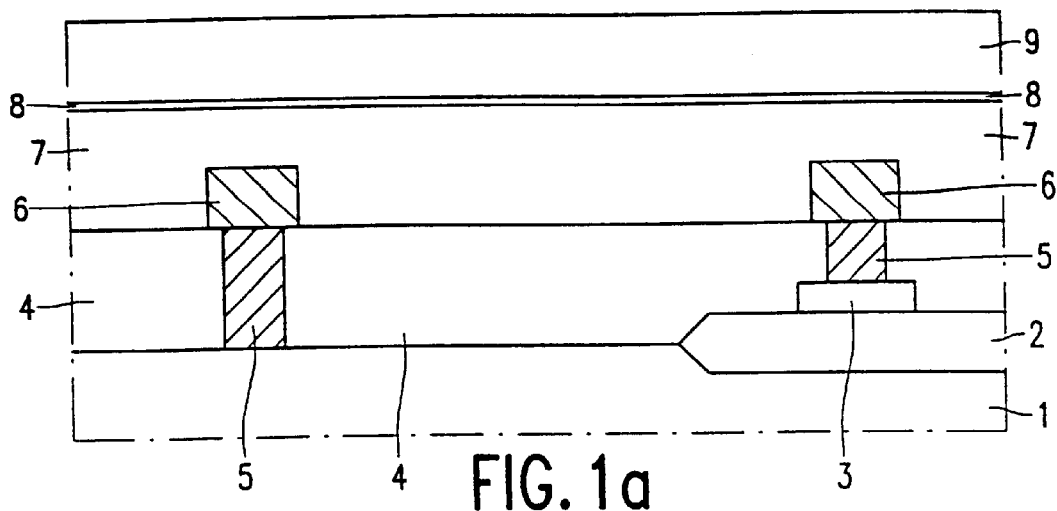
FIG. 1 is a cross-section of a semiconductor device during its manufacture by a first embodiment of a method according to the invention being used.

The invention will be explained with reference to the back end process in the manufacture of an integrated circuit. Standard techniques may be used for the process steps preceding the steps described here and will not be discussed in any detail. The stage in the process shown in FIG. 1a is the starting point. The device comprises a semiconductor body 1 of a suitable material, for example silicon, which has been provided in known manner with circuit elements comprising doped zones, electrodes, etc., which are not shown in any detail. The drawing only shows part of a conductor pattern 3 made of, for example, polycrystalline silicon (poly) or silicide on field oxide 2. After the layer(s) 3 has/have been formed, a layer 4 of silicon oxide is deposited over the assembly, and studs 5, for example made of tungsten, are formed therein in known manner. As is apparent from the drawing, a W stud is connected to the conductor track 3. The studs may be provided in known manner in that a thick tungsten layer is provided over the assembly after windows have been formed in the oxide layer 4, and this tungsten layer is etched back. In a next series of steps, an interconnecting wiring is provided, for example in the form of aluminum tracks 6. It is no longer possible now to carry out steps at an elevated temperature, i.e. at a temperature above 500° C. in the present example, because of the low melting point of aluminum or alloys of aluminum and silicon.

Subsequently, a thick oxide layer 7 is deposited again and, if necessary, planarized in a known manner. Then a layer 8 of $Ge_xSi_{1-x}$ is provided over the entire assembly. As will be clear from the description below, the layer 8 may be provided for various reasons or a combination of reasons. The layer 8 is provided by LPCVD techniques which are known per se through the decomposition of a gas comprising Si such as, for example, $SiH_4$, to which a quantity of gas comprising Ge, for example in the form of $GeH_4$, was added. The addition of Ge renders it possible to reduce the deposition temperature, which is preferably above 550° C. for silicon (polycrystalline or amorphous), to below 550° C., preferably to below 500° C., and even to below 400° C. in dependence on the quantity of Ge. In a specific embodiment, the molar fraction x was 0.4 and the thickness of the layer 8 was approximately 100 nm. The deposition temperature was approximately 450° C. A photoresist layer 9 is provided on the layer 8. This stage of the process is depicted in FIG. 1a.

Figure 1B:
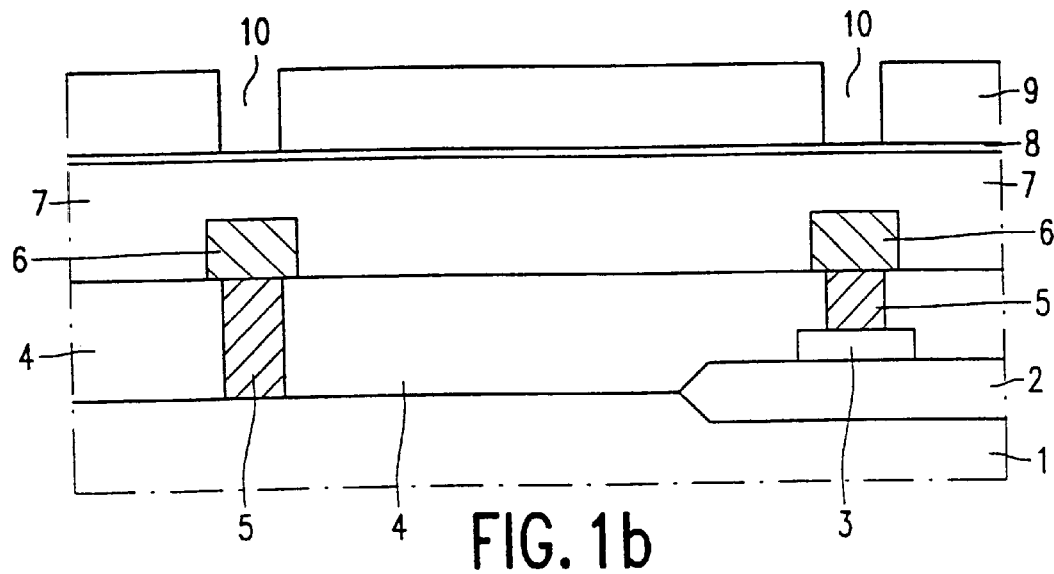
Figure 1C:
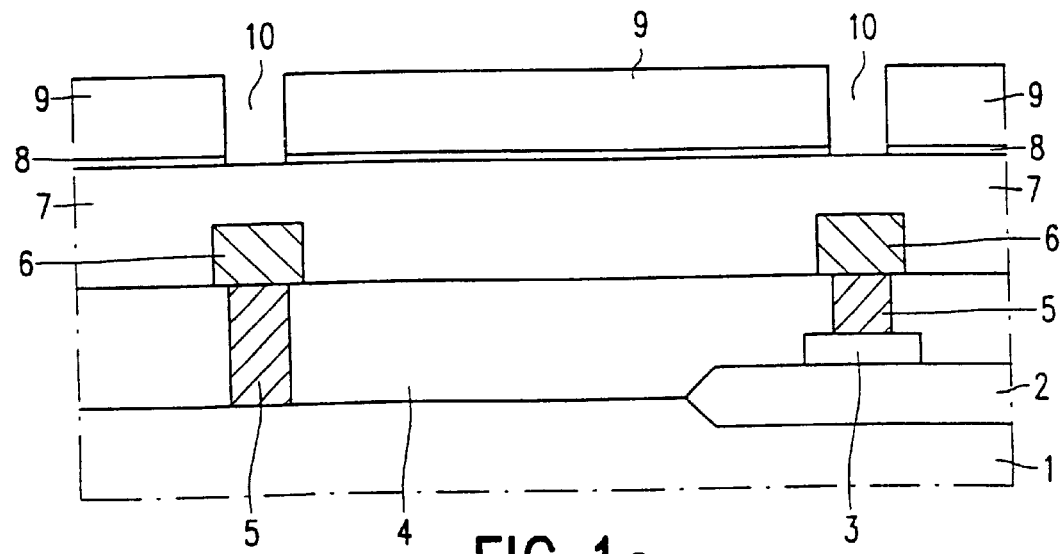
Figure 1D:
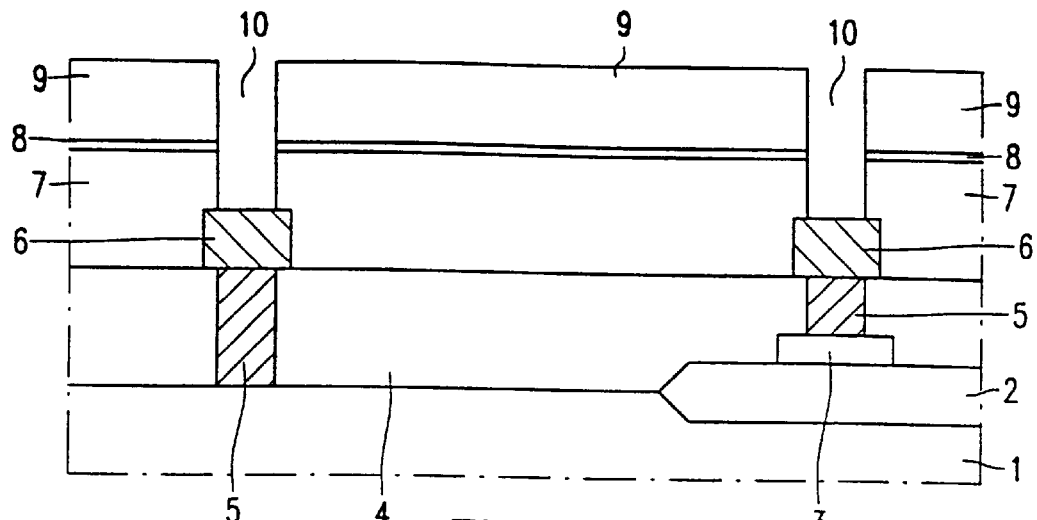
Figure 2A:
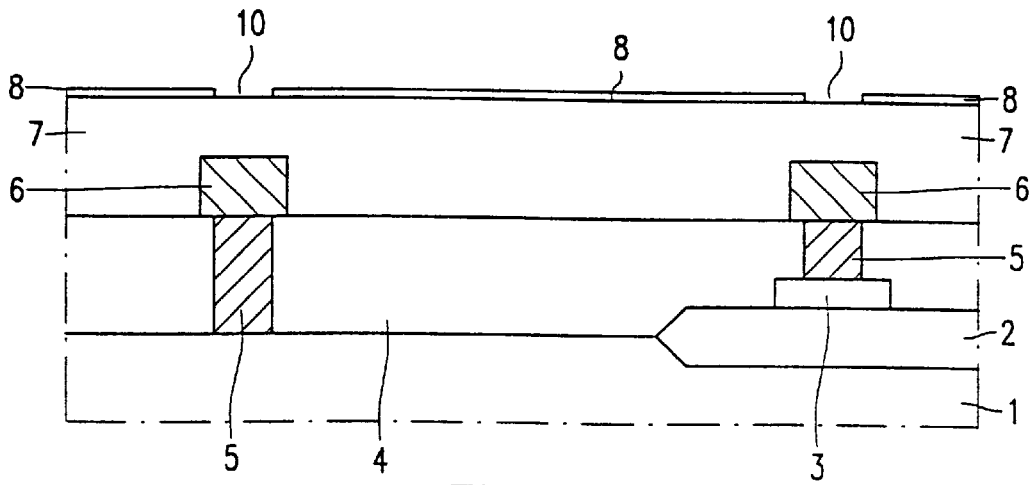
FIG. 2 is a cross-section of this device manufactured by a modification of the method of FIG. 1.
Figure 1F:
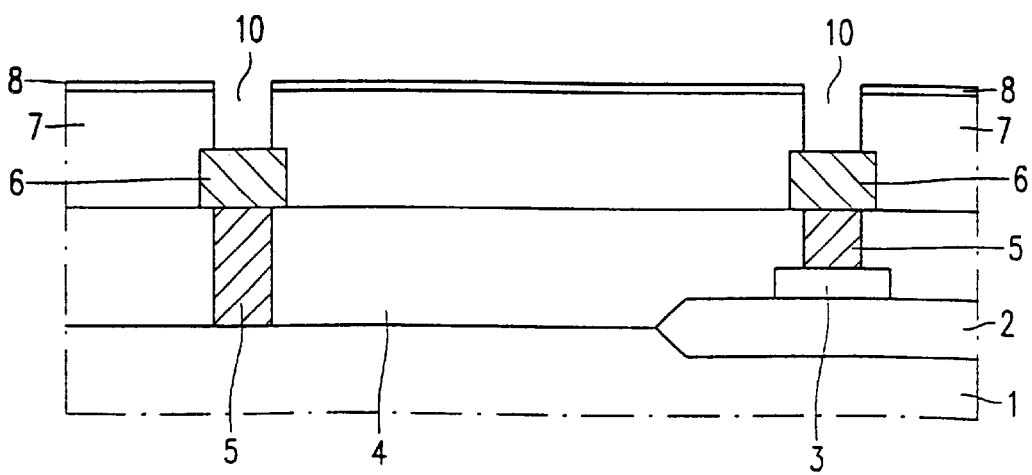

A mask is formed in a usual manner in the layer 9, for example with openings 10 above the Al tracks 6, see FIG. 1b. Reflection of the light by inter alia the Al tracks 6 is prevented by the layer 8 during the exposure. Exposed portions of the GeSi layer 8 are subsequently removed in the openings 10 by means of plasma etching in, for example, $Cl_2/HBr$, see FIG. 1c. In a first embodiment shown in FIG. 1d, the openings 10 are subsequently formed in the oxide layer 7 in the presence of the photoresist mask 9, for example by means of etching in a plasma of $CF_4$ or $CF_3$ in Ar. Then the photoresist layer 9 is removed, see FIG. 1f. In an alternative embodiment, the photoresist layer 9 is removed after the openings 10 have been formed in the GeSi layer 8, as shown in FIG. 2a. The GeSi layer 8 is then used as a hard mask for forming the pattern of openings 10 in the oxide layer 7. The use of the layer 8 as a hard mask has several advantages. Thus, for example, it is easier to etch openings, 10 with very small dimensions (for example 0.5 $\mu$m and smaller) in the layer 7 as a result of the favorable aspect ratio. After etching of the openings 10 in the oxide layer 7, the situation as shown in FIG. 1f is obtained again.

Figure 1G:
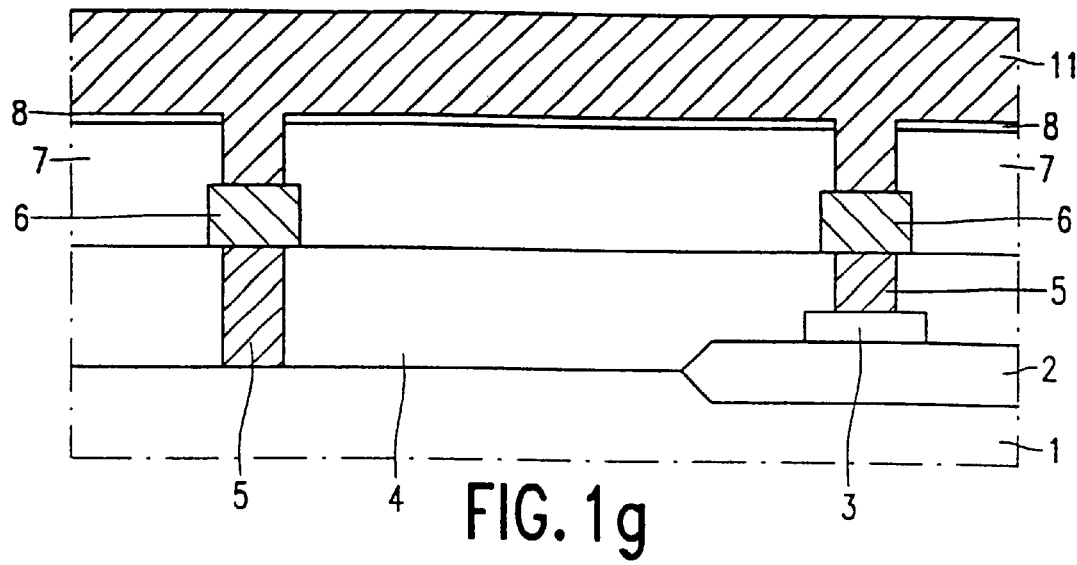
Figure 1H:
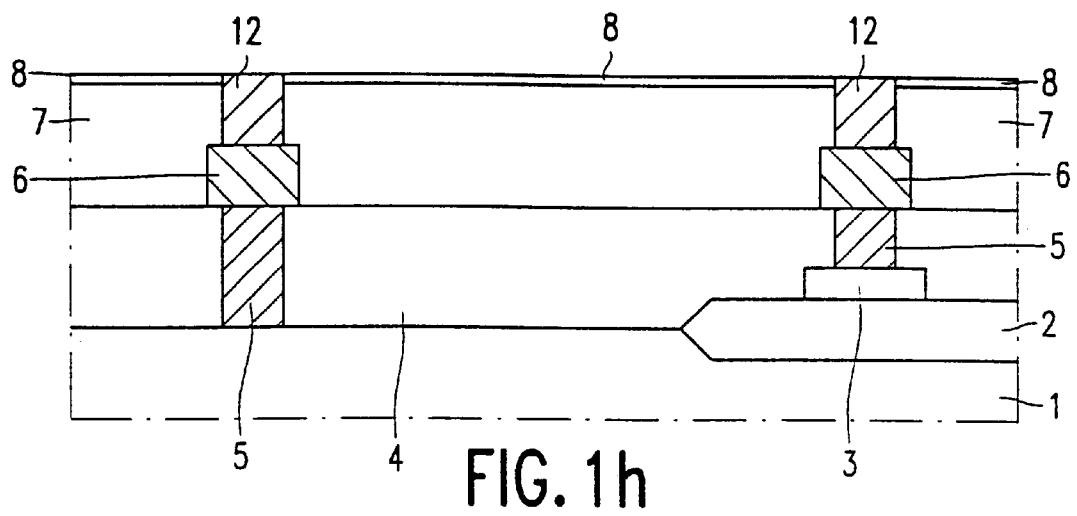
Figure 1I:
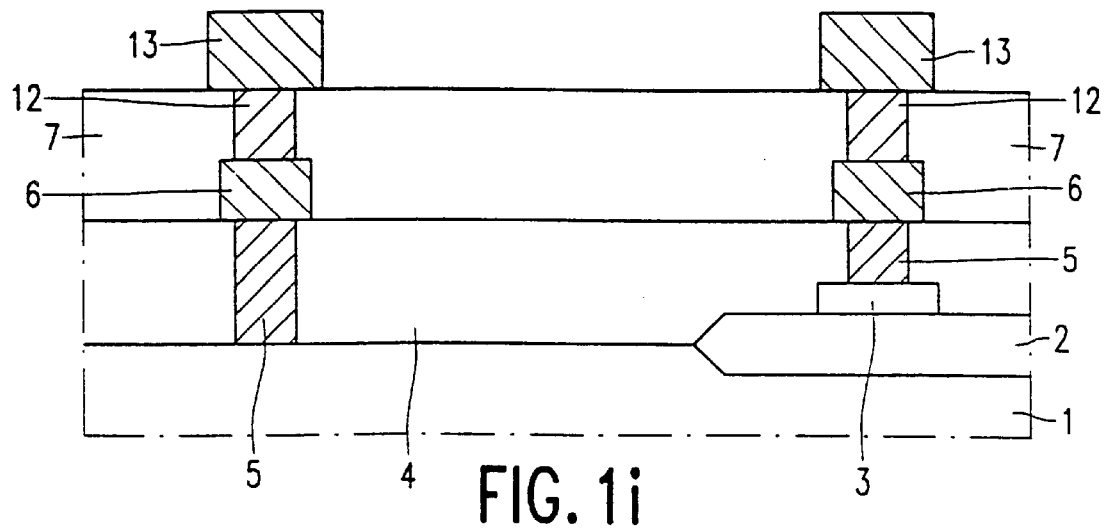

Then a tungsten layer 11 is provided by means of CVD, possibly preceded by the deposition of a thin adhesion layer (not shown in the drawing) such as, for example, Ti/TiN, see FIG. 1g. Etching back of the tungsten layer creates the contact 12 as shown in FIG. 1h. Etching back may take place in a manner known per se through plasma etching, the etching process stopping when the GeSi layer 8 is reached. In another embodiment, which may be used to advantage when the surface to be etched is not plane, the tungsten layer is removed by chemical-mechanical polishing (CMP), during which the GeSi layer 8 serves as a CMP buffer layer the moment the layer 11 has been removed outside the contacts 12. The GeSi layer 8 may be removed after this, at the same time also removing residues of the CMP step from the surface. An Al pattern 13 (FIG. 1i) may then be provided in a usual manner.

A further embodiment of a method according to the invention will be described with reference to FIG. 3. The drawing shows part of the metallization region for simplicity's sake, with an Al track 15 situated on an oxide layer 16. The Al track 15 is covered with an inter-metal dielectric, for example in the form of a silicon oxide layer 17 again. A GeSi layer 8 is deposited on the oxide layer 17 by CVD or LPCVD at a temperature of approximately 400° C. A window 18, which defines a via to the Al track 15, is formed in the GeSi layer 8 in a usual manner by means of a photoresist mask (not shown in the drawing) and etching. With the GeSi layer 8 acting as a hard mask, a depression 19 is subsequently formed in the oxide layer 17 by anisotropic etching at the area of the opening 18. The depression 19 extends through only part of the thickness of the oxide layer 17 into this layer, for example through half its thickness, so that part of the oxide layer 17 remains between the depression 19 and the Al track 15, see FIG. 3a.

Figure 3A:
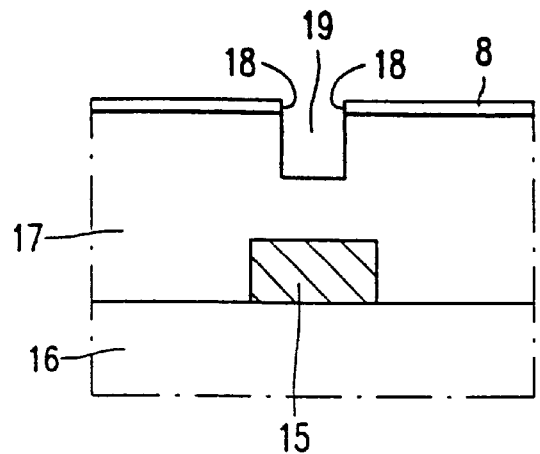
FIG. 3 is a cross-section of a semiconductor device manufactured by a further embodiment of a method according to the invention, in different stages of its manufacture.
Figure 3B:
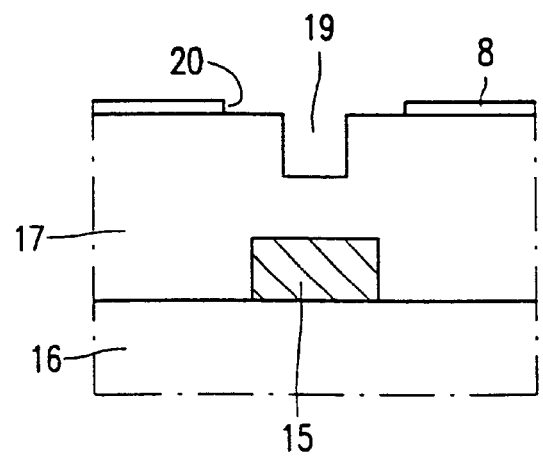
Figure 3C:
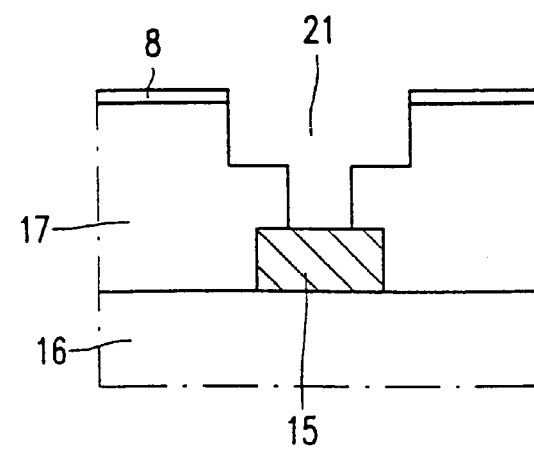
Figure 3D:
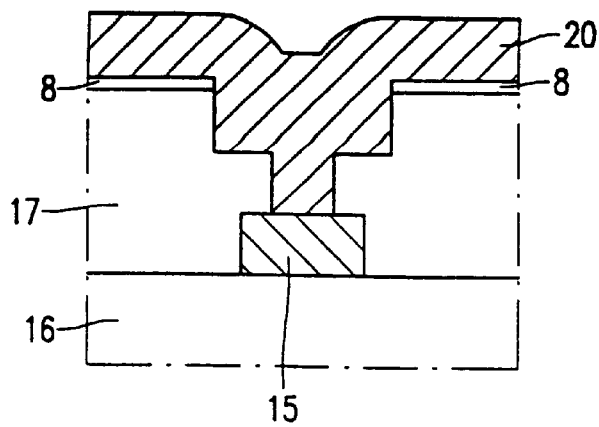
Figure 3E:
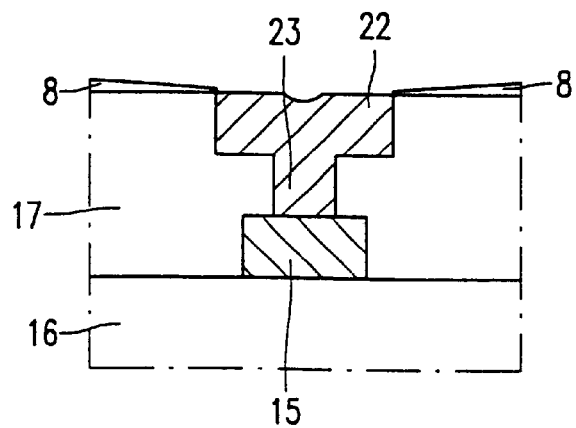
Figure 3F:
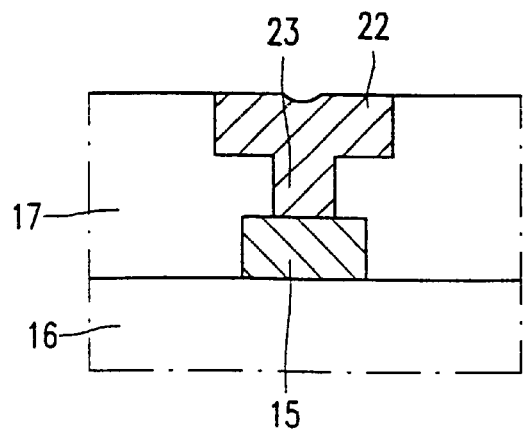

In a next stage shown in FIG. 3b, an interconnecting pattern for the next wiring layer is formed in a usual photolithographical manner in the GeSi layer 8, the opening 18 being enlarged thereby, while at the area of the via to be formed the opening 20 is obtained in the GeSi layer. An anisotropic etching treatment is carried out on the oxide layer 17 through the opening 20 (FIG. 3c), which etching is continued until the Al track 15 is reached. After an adhesion layer or barrier layer of, for example, TiW or Ti/TiN (not shown in the drawing) has been deposited, if so desired, a layer 20 of a suitable metal, for example W, is deposited by sputtering or vapor deposition, filling up the groove 21 entirely, see FIG. 3d. Other metals such as Al or Cu may obviously be used instead of W. Then the metal 20 is completely removed outside the groove 21, preferably by CMP techniques, although plasma etching is also possible, see FIG. 3e. A metal interconnection 22 is obtained in this stage, which merges at the level of the Al track 15 into a via 23 which connects the Al track 15 to the interconnection 23. Oxide erosion and scratching in the surface of the oxide layer 17 are prevented by the GeSi layer 8 during the removal of the layer 20. In a next step, the adhesion layer and the GeSi layer 8 are removed, during which any remnants of the CMP process present on the surface can be removed at the same time again, see FIG. 3f. The device may then be subjected to usual further treatments.

Figure 4A:
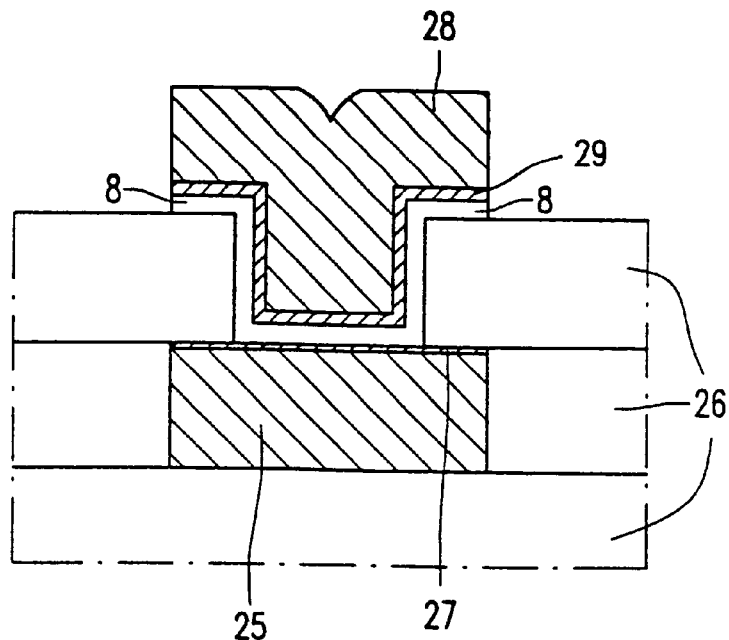
FIG. 4 is a cross-section of a programmable cell in the non-programmed and the programmed state, manufactured through the use of a further embodiment of a method according to the invention.
Figure 4B:
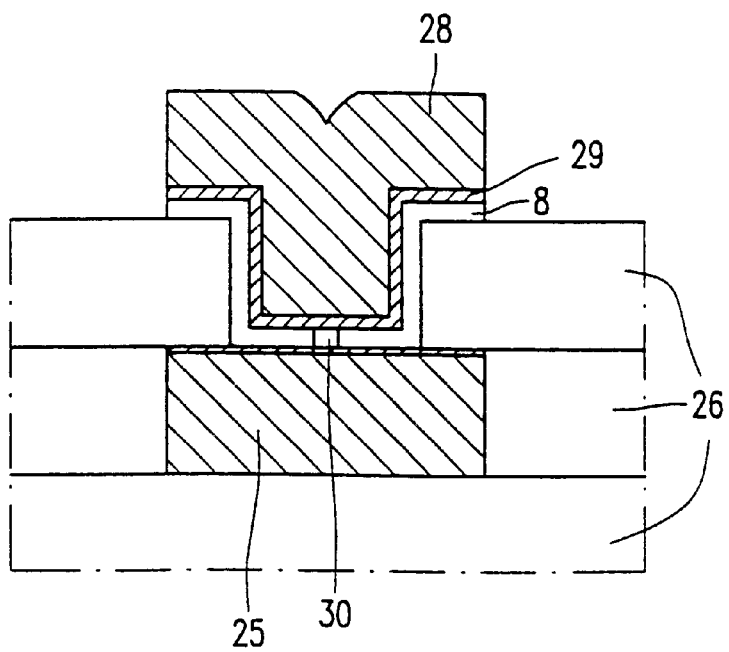

FIG. 4 shows a programmable element in cross-section in the form of a metal-metal antifuse, manufactured by a method according to the invention. FIG. 4a shows the device in the non-programmed state; FIG. 4b shows the device in the programmed state. The technique may be used in non-volatile memories, but also in circuits, for example in FPGAs (Field Programmable Gate Arrays). The silicon body itself is not shown in the drawing, only the silicon oxide layer 26 which covers the silicon body. The first metal layer is formed by the Al track 25 on which a barrier layer 27, for example made of Ti, is deposited. After the via has been formed in the upper oxide layer 26, the high-ohmic amorphous GeSi layer 8 is deposited by LPCVD at a temperature of approximately 400° C. The thickness is chosen to lie between 50 and 100 nm. The value of 0.4 is taken again, for example, for the molar fraction of Ge. The second metal is formed, for example, also by an Al track 28 which is separated from the GeSi layer 8 by the barrier layer 29. The cell can be programmed in that a voltage pulse of sufficient amplitude is applied between the metal tracks 25 and 28, as a result of which the dielectric layer 8 melts locally and a conducting connection 30 is created between the conductors 25 and 28. The cell has the major advantage that the dielectric layer 8 has a good step covering owing to the CVD technique, so that an undesirable breakdown in the corners is prevented, where constrictions often occur with the use of alternative deposition techniques. The addition of Ge during the deposition renders it possible to choose the deposition temperature to lie so low that a well-conducting metal such as Al can be chosen for the lower conductor layer 25.

It will be obvious that the invention is not limited to the examples given here but that many more variations are possible to those skilled in the art within the scope of the invention. Thus a different value may be chosen for the Ge fraction instead of the value in the examples described here.

What is claimed is:

1. A method of manufacturing a monolithic semiconductor device with a semiconductor body, including the step of providing doped zones forming circuit elements in said body, forming a polycrystalline or amorphous semiconductor layer over the entire device in a stage in which the device has previously been provided with a metallization layer, and providing the semiconductor layer as a $Ge_xSi_{1-x}$ layer, referred to as a GeSi layer hereinafter, by means of CVD at a temperature which is lower than about 550° C., x representing the molar fraction of Ge.

2. A method as claimed in claim 1, characterized in that a photoresist layer is provided over the device after the GeSi layer and is patterned through exposure and development.

3. A method as claimed in claim 2, characterized in that the GeSi layer is provided on a dielectric layer, and in that the pattern formed in the photoresist layer is transferred into the GeSi layer and the subjacent dielectric layer by means of etching.

4. A method as claimed in claim 3, characterized in that, after the pattern has been transferred into the GeSi layer, the photoresist layer is removed before the dielectric layer is subjected to the etching treatment.

5. A method as claimed in claim 2, characterized in that a layer comprising aluminum is used for the first metal layer.

6. A method as claimed in claim 3, characterized in that, after etching, a second metal layer is provided over the surface thus obtained, filling up entirely the openings in the dielectric layer formed by etching, from which second metal layer a pattern corresponding to the pattern in the dielectric layer is subsequently formed by means of a homogeneous removal of metal.

7. A method as claimed in claim 6, characterized in that the material-removing step is stopped when the GeSi layer is reached, whereupon the GeSi layer is removed by means of an etching treatment.

8. A method as claimed in claim 7, characterized in that a layer comprising aluminum is used for the first metal layer.

9. A method as claimed in claim 6, characterized in that the metal of the second metal layer is removed by chemical-mechanical polishing.

10. A method as claimed in claim 9, characterized in that a layer comprising aluminum is used for the first metal layer.

11. A method as claimed in claim 6, characterized in that the metal of the second metal layer is removed by chemical-mechanical polishing.

12. A method as claimed in claim 6, characterized in that a layer comprising aluminum is used for the first metal layer.

13. A method as claimed in claim 3, characterized in that, after etching, a second metal layer is provided over the surface thus obtained, filling up entirely the openings in the dielectric layer formed by etching, from which second metal layer a pattern corresponding to the pattern in the dielectric layer is subsequently formed by means of a homogeneous removal of metal.

14. A method as claimed in claim 3, characterized in that a layer comprising aluminum is used for the first metal layer.

15. A method as claimed in claim 4, characterized in that a layer comprising aluminum is used for the first metal layer.

16. A method as claimed in claim 1, characterized in that the GeSi layer is provided in the form of an amorphous layer between two metal conductors so as to form an electrically programmable element which can be brought from a high-ohmic state into a low-ohmic state through the application of a voltage between the metal conductors.

17. A method as claimed in claim 1, characterized in that a layer comprising aluminum is used for the first metal layer.

* * * * *